US009006758B2

(12) United States Patent
Yoneda

(10) Patent No.: US 9,006,758 B2
(45) Date of Patent: Apr. 14, 2015

(54) LIGHT-EMITTING ELEMENT AND DISPLAY DEVICE USING SAME

(75) Inventor: Kazuhiro Yoneda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/884,640

(22) PCT Filed: Jun. 1, 2012

(86) PCT No.: PCT/JP2012/003628
§ 371 (c)(1),
(2), (4) Date: May 10, 2013

(87) PCT Pub. No.: WO2013/179360
PCT Pub. Date: Dec. 5, 2013

(65) Prior Publication Data
US 2013/0334547 A1    Dec. 19, 2013

(51) Int. Cl.
*H01L 29/02* (2006.01)
*H01L 33/24* (2010.01)
*H01L 51/52* (2006.01)
*H01L 27/32* (2006.01)

(52) U.S. Cl.
CPC ............... *H01L 33/24* (2013.01); *H01L 51/52* (2013.01); *H01L 51/5265* (2013.01); *H01L 27/3211* (2013.01); *H01L 2251/558* (2013.01)

(58) Field of Classification Search
CPC .................................................... H01L 33/24
USPC ............................................ 257/89, E33.001
See application file for complete search history.

(56) References Cited

U.S. PATENT DOCUMENTS

| 5,443,922 | A | 8/1995 | Nishizaki et al. |
| 8,779,453 | B2 * | 7/2014 | Kurata et al. .................. 257/98 |
| 2007/0102737 | A1 * | 5/2007 | Kashiwabara et al. ....... 257/291 |
| 2012/0104423 | A1 | 5/2012 | Kurata et al. |
| 2012/0126272 | A1 * | 5/2012 | Kurata et al. .................. 257/98 |
| 2013/0119416 | A1 | 5/2013 | Yoneda et al. |

FOREIGN PATENT DOCUMENTS

| JP | 05-163488 | 6/1993 |
| JP | 2005-116516 | 4/2005 |
| JP | 2010-212257 | 9/2010 |
| JP | 2012-054091 | 3/2012 |
| JP | 2012-079712 | 4/2012 |
| JP | 2012-156075 | 8/2012 |

OTHER PUBLICATIONS

ISR dated Nov. 13, 2012.

* cited by examiner

*Primary Examiner* — Lex Malsawma
*Assistant Examiner* — Patricia Reddington
(74) *Attorney, Agent, or Firm* — Greenblum & Bernstein, P.L.C.

(57) ABSTRACT

A light-emitting element includes a reflective electrode, a light-transmitting electrode disposed opposite the reflective electrode, a light-emitting layer emitting blue light disposed between the reflective electrode and the light-transmitting electrode, and a functional layer disposed between the reflective electrode and the light-emitting layer. The optical thickness of the functional layer is no less than 428.9 nm and no more than 449.3 nm.

2 Claims, 11 Drawing Sheets

FIG. 3

|  | Physical thickness [nm] | Refractive index (460 nm) | Optical thickness [nm] | |
|---|---|---|---|---|
| Resin sealing layer 10 | 6000 | 1.55 | | |
| Thin-film sealing layer 9 | 1000 | 1.90 | | |
| Translucent electrode 8 | 100 | 2.21 | | |
| Electron transport layer 7 | 20 | 1.75 | | |
| Light-emitting layer 6b | 60 | 1.81 | | |
| Hole transport layer 5 | 40 | 1.88 | 75.2 | |
| Hole injection layer 4 | 40 | 1.55 | 62.0 | 428.9-449.3 |
| Transparent conductive layer 3 | 143-153 | 2.04 | 291.7-312.1 | |
| Reflective electrode 2 | 150 | | | |

Photoluminescence Spectrum

Luminous Efficiency (at 150 nm)

Color (at 150 nm)

Luminous Efficiency (at 20 nm)

Transparent conductive layer thickness [nm]

Color (at 20 nm)

Transparent conductive layer thickness [nm]

FIG. 11

| Physical thickness of transparent conductive layer [nm] | 142 | 143 | 150 | 153 | 154 |
|---|---|---|---|---|---|
| Optical thickness of first functional layer [nm] | 426.9 | 428.9 | 443.2 | 449.3 | 451.4 |
| Efficiency ratio | 0.83 | 0.86 | 1.00 | 1.05 | 1.08 |
| Luminous efficiency tolerance range | 135-152 nm | 136-152 nm | 135-154 nm | 133-157 nm | 147-157 nm |
| Color tolerance range | 139-166 nm | 138-167 nm | 141-165 nm | 141-164 nm | 141-165 nm |
| Thickness tolerance span | 13 nm | 14 nm | 13 nm | 16 nm | 10 nm |

FIG. 12

| | Standard | 20 nm | 45 nm | 80 nm | 150 nm |
|---|---|---|---|---|---|
| Efficiency ratio | – | 0.50 | 1.10 | 0.33 | 1.00 |
| Transparent conductive layer thickness tolerance span | Luminous efficiency ±10% Color ±0.015 | 7 nm | 4 nm | 6 nm | 13 nm |
| Light-emitting layer thickness tolerance span | Luminous efficiency ±7.5% Color ±0.015 | 8 nm | 16 nm | 11 nm | 24 nm |

LIGHT-EMITTING ELEMENT AND DISPLAY DEVICE USING SAME

TECHNICAL FIELD

The present disclosure pertains to a light-emitting element such as an organic electroluminescence element, to a display device using such a light-emitting element, and particularly to optical settings for the light-emitting element.

BACKGROUND ART

In recent years, the development of light-emitting elements, such as organic EL elements, has advanced. Also, display devices using light-emitting elements are being developed, and such display devices employ an arrangement of blue, green, and red light-emitting elements.

Considerations such as reducing electric power consumption have placed value on luminous efficiency improvements for light-emitting elements. Blue light-emitting elements in particular have low luminous efficiency in comparison to green and red light-emitting elements. As such, there is demand for improving the luminous efficiency of blue light-emitting elements.

Conventionally, technology for employing a resonator structure in a light-emitting element is known as one approach to improving the luminous efficiency. For example, Patent Literature 1 discloses a light-emitting element in which a bottom electrode (a mirror), a transparent conductive layer, a hole transport layer, a light-emitting layer, a electron transport layer, and a top electrode (a half-mirror) are layered, and further discloses adjusting the optical thickness between the mirror and the half-mirror so as to amplify the luminous efficiency (see paragraph 0012). These adjustments to the optical thickness are performed by adjusting the physical thickness of the layers making up the light-emitting element.

CITATION LIST

Patent Literature

Patent Literature 1

Japanese Patent Application Publication No. 2005-116516

SUMMARY OF INVENTION

Technical Problem

Typically, manufacturing error in the physical thickness of each layer is an unavoidable part of the light-emitting element manufacturing process. As such, when manufacturing error is taken into consideration, simply employing a resonator structure for the light-emitting element does not suffice. For example, when the physical thickness of the layers making up the light-emitting element differs from the setting values therefor within the error tolerance range, the resonator structure is evidently not practical for the extreme reduction in light-emitting element characteristics such as the luminous efficiency and so on. Accordingly, a resonator structure is desired in which the light-emitting element characteristics are unlikely to deviate from the setting values despite the physical thickness of the layers differing from the setting values (i.e., having a wide tolerance range for manufacturing error).

The present disclosure aims to provide a light-emitting element having high luminous efficiency and a wide tolerance range for manufacturing error, as well as a display device using the light-emitting element.

Solution to Problem

A light-emitting element pertaining to an aspect of the present disclosure comprises: a reflective electrode; a light-transmitting electrode disposed opposite the reflective electrode; a light-emitting layer emitting blue light and disposed between the reflective electrode and the light-transmitting electrode; and a functional layer disposed between the reflective electrode and the light-emitting layer, wherein the functional layer has an optical thickness of no less than 428.9 nm and no more than 449.3 nm.

Advantageous Effects of Invention

According to the above-described numerical range, a light-emitting element that has high luminous efficiency and a wide tolerance range for manufacturing error is realised.

BRIEF DESCRIPTION OF DRAWINGS

FIG. 3 is a table of sample measurements, such as physical thickness, for layers of the blue organic electroluminescence element.

FIG. 11 indicates results obtained from a simulation.

FIG. 12 is a table indicating a thickness tolerance span for the transparent conductive layer and for a light-emitting layer.

DESCRIPTION OF EMBODIMENT

[Overview of Embodiment]

In one aspect, a light-emitting element comprises: a reflective electrode; a light-transmitting electrode disposed opposite the reflective electrode; a light-emitting layer emitting blue light and disposed between the reflective electrode and the light-transmitting electrode; and a functional layer disposed between the reflective electrode and the light-emitting layer, wherein the functional layer has an optical thickness of no less than 428.9 nm and no more than 449.3 nm.

Also, the functional layer has a physical thickness of no less than 204 nm and no more than 300 nm, and has a refractive index of no less than 1.5 and no more than 2.1.

In addition, a colour filter is disposed opposite the light-emitting layer with respect to the light-transmitting electrode.

In another aspect, a light-emitting element comprises: a reflective electrode; a light-transmitting electrode disposed opposite the reflective electrode; a light-emitting layer emitting blue light and disposed between the reflective electrode and the light-transmitting electrode; and a functional layer disposed between the reflective electrode and the light-emitting layer, wherein given a luminous efficiency E1 of the light-emitting element with no colour filter, and a luminous efficiency E2 of the light-emitting element with a colour filter, an optical thickness of the functional layer satisfies: a first condition requiring an efficiency ratio that is equal to or greater than 0.85, the efficiency ratio being calculated by: taking, as the denominator, a value of the luminous efficiency E2 when the optical thickness of the functional layer has been adjusted to produce an extreme value of the luminous efficiency E1 and colour filter characteristics have been adjusted to achieve a target chromaticity; and taking, as the numerator, a value of the luminous efficiency E2 when the colour filter characteristics have been adjusted to achieve the target chromaticity for a given optical thickness of the functional layer; and a second condition requiring that, when the colour filter characteristics have been adjusted to achieve the target chromaticity for the given optical thickness of the functional layer, and the optical thickness of the functional layer has been changed while the colour filter characteristics remain stable, a variation in the luminous efficiency E2 is within ±10%, a variation in chromaticity is within ±0.015, and an optical thickness range satisfying both is at least 20 nm.

In a further aspect, a display device comprises: a light-emitting element emitting blue light; a light-emitting element emitting green light; and a light-emitting element emitting red light, wherein the light-emitting element emitting the blue light is the light-emitting element described above.

[Embodiment]

<1> Configuration

An Embodiment of the present disclosure is described below, with reference to the accompanying drawings.

Figure 1:
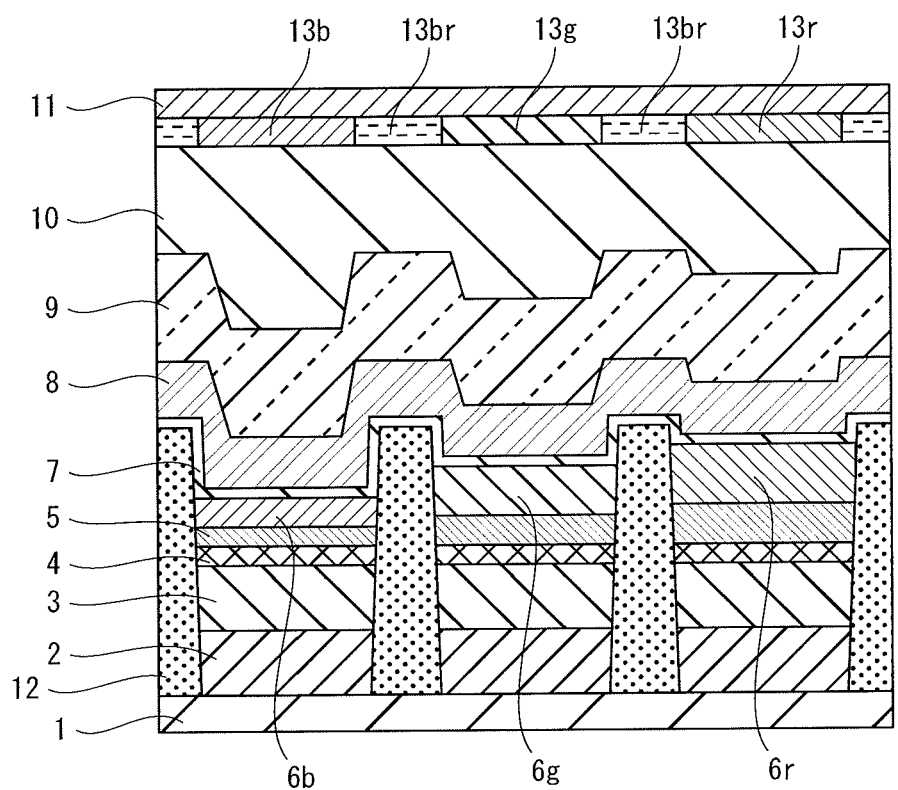
FIG. 1 is a cross-sectional diagram schematically illustrating a pixel configuration of a display device pertaining to an Embodiment.

FIG. 1 is a cross-sectional diagram schematically illustrating the pixel configuration of a display device pertaining to the present Embodiment.

Blue, green, and red pixels are arranged regularly along the row and column dimensions of the display device. Each of the pixels includes a light-emitting element employing the phenomenon of electroluminescence. The present Embodiment describes an example of an organic electroluminescent element (hereinafter, organic EL element) in which the light-emitting element uses an organic light-emitting material.

A blue organic EL element includes substrate 1, a reflective electrode 2, a transparent conductive layer 3, a hole injection layer 4, a hole transport layer 5, light-emitting layer 6b, an electron transport layer 7, a light-transmitting electrode 8, a thin-film sealing layer 9, a resin sealing layer 10, substrate 11, and colour filter 13b. Hereinafter, a layer disposed between the reflective electrode 2 and light-emitting layer 6b is termed a first functional layer (i.e., the transparent conductive layer 3, the hole injection layer 4, and the hole transport layer 5 in the present Embodiment), and a layer disposed between light-emitting layer 6b and the light-transmitting electrode 8 is termed a second functional layer (i.e., the electron transport layer 7 in the present Embodiment).

A green organic EL element is configured similarly to the blue organic EL element, with the exception of light-emitting layer 6g and colour filter 13g. A red organic EL element is also configured similarly to the blue organic EL element, with the exception of light-emitting layer 6r and colour filter 13r. In the present example, the blue, green, and red organic EL element are provided with several components in common, specifically substrate 1, the electron transport layer 7, the light-transmitting electrode 8, the thin-film sealing layer 9, the resin sealing layer 10, and substrate 11. In contrast, the reflective electrode 2, the transparent conductive layer 3, the hole injection layer 4, the hole transport layer 5, and light-emitting layers 6b, 6g, and 6r are provided separately for each organic EL element. Among these, the reflective electrode 2, the transparent conductive layer 3, the hole injection layer 4, the hole transport layer 5, and light-emitting layers 6b, 6g, and 6r for each organic EL element are partitioned by banks 12. The colour filters 13b, 13g, and 13r for each organic EL element are further partitioned by a black matrix 13br.

Figure 2:
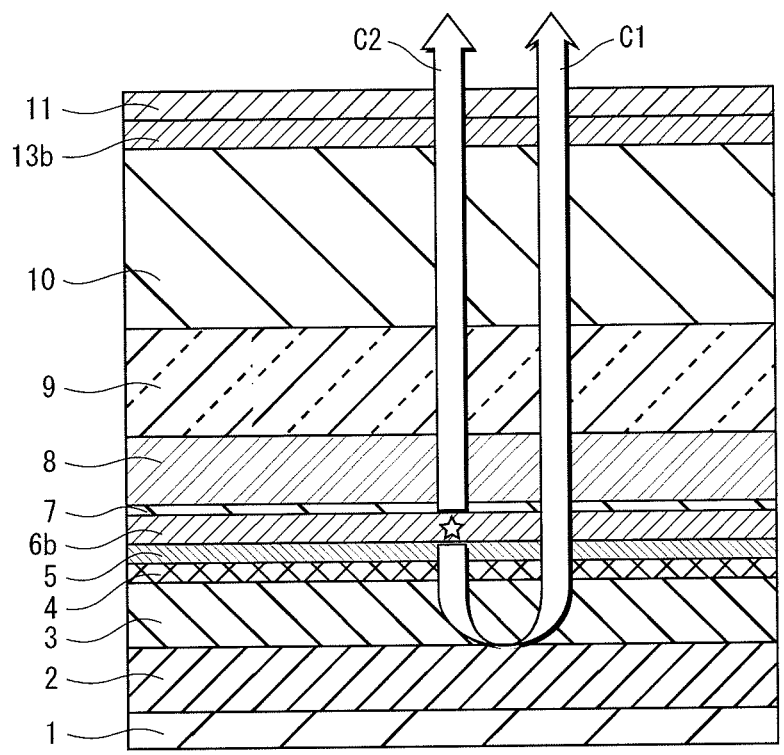
FIG. 2 illustrates an example of a resonator structure in a blue organic electroluminescence element.

A resonator structure is realised for the organic EL elements of each colour through the optical interference effect imparted by the reflective electrode 2. FIG. 2 illustrates an example of the resonator structure in the blue organic EL element. The organic EL element includes a first optical path C1 and a second optical path C2. In the first optical path C1, a first portion of light emitted by light-emitting layer 6b passes through the first functional layer reaching the reflective electrode 2, and upon being reflected by the reflective electrode 2, passes through the first functional layer, light-emitting layer 6b, the second functional layer, and the light-transmitting electrode 8 to be emitted externally. In the second optical path C2, a second portion of the light emitted by light-emitting layer 6b passes through the second functional layer to reach the light-transmitting electrode 8 without reaching the reflective electrode 2, and passes through the light-transmitting electrode 8 to be emitted externally. Adjusting the optical thickness of the first functional layer as appropriate enables the light passing through the first optical path C1 and the light passing through the second optical path C2 to be mutually strengthened through the optical interference effect, thus improving luminous efficiency.

In the present Embodiment, the optical thickness of the first functional layer for the blue organic EL element is 428.9 nm to 449.3 nm, inclusive. Accordingly, luminous efficiency is improved for the blue organic EL element, and the allowable tolerance for manufacturing error is increased. The details are provided below.

<2> Simulation

<2-1> Step 1

Figure 4:
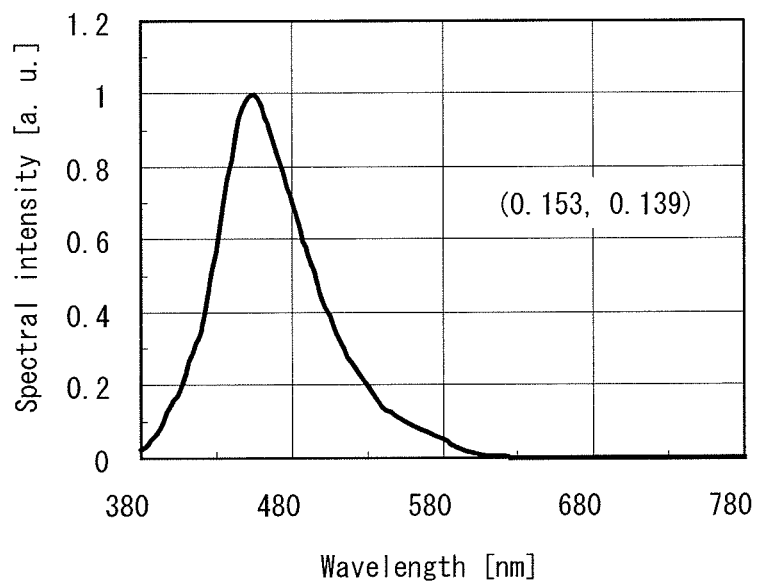
FIG. 4 indicates a photoluminescence spectrum of a light-emitting material used in the blue organic electroluminescence element.

The inventors performed a simulation to observe the changes in luminous efficiency and in chromaticity that occur when the optical thickness of the first functional layer is varied. FIGS. 3 and 4 indicate organic EL element parameters used in the simulation.

FIG. 3 provides a table of sample measurements, such as the physical thickness of each layer, for the blue organic EL element. The refractive index column of FIG. 3 indicates the refractive index obtained with a wavelength of 460 nm.

FIG. 4 indicates the photoluminescence spectrum (hereinafter, PL spectrum) of the light-emitting material used in the blue organic EL element. The light-emitting material has CIE chromaticity diagram coordinates of (0.153, 0.139).

Figure 5:
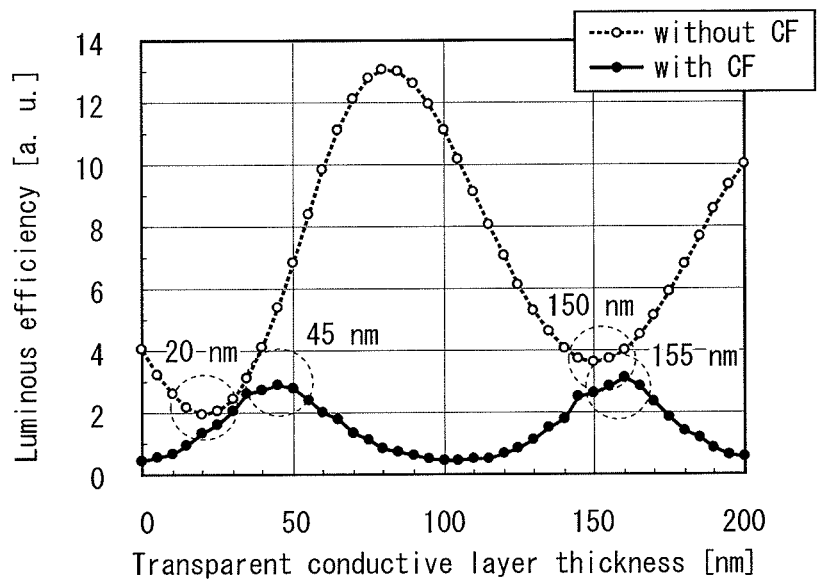
FIG. 5 is a graph illustrating the relationship between physical thickness of a transparent conductive layer and luminous efficiency, given an organic electroluminescence element having the parameters of FIGS. 3 and 4.

FIG. 5 is a graph illustrating the relationship between the physical thickness of the transparent conductive layer 3 and the luminous efficiency, given an organic EL element having the parameters of FIGS. 3 and 4.

In the simulation, the optical thickness of the first functional layer varies according to changes in the physical thickness of the transparent conductive layer 3. The physical thickness of all layers other than the transparent conductive layer 3 is fixed, as is the refractive index of each layer. Accordingly, the physical thickness of the transparent conductive layer 3 as referred to in the following explanation may be interpreted as representing the optical thickness of the first functional layer. As for the numerical values given, relative values may be used as-is, but absolute values require conversion. In the following explanation, converted values are provided alongside absolute values where needed.

The dashed line of FIG. 5 indicates the luminous efficiency when no colour filter (labelled CF) is present in the organic EL element. In the following discussion, luminous efficiency E1 represents the situation with no colour filter. The physical thickness of the transparent conductive layer 3 has been varied in 5 nm increments, and luminous efficiency E1 is calculated for each physical thickness. As shown in FIG. 5, changing the physical thickness of the transparent conductive layer 3 causes a change in luminous efficiency E1 due to the optical interference effect. Further, luminous efficiency E1 is at a local minimum when the physical thickness of the transparent conductive layer 3 is 20 nm or 150 nm, but is at a local maximum when the physical thickness of the transparent conductive layer 3 is 80 nm.

The solid line of FIG. 5 indicates the luminous efficiency when the colour filter is present in the organic EL element. In the following discussion, luminous efficiency E2 represents the situation with the colour filter. The physical thickness of the transparent conductive layer 3 has been varied in 5 nm increments, and luminous efficiency E2 is calculated for each physical thickness, with the characteristics of the colour filter being set appropriately. In the simulation, the colour filter characteristics are adjusted for a target chromaticity (i.e., the y component of the CIE chromaticity) of 0.06 in the emitted colour of the organic EL element. The y component of the CIE chromaticity is hereinafter represented as CIEy.

Figure 6:
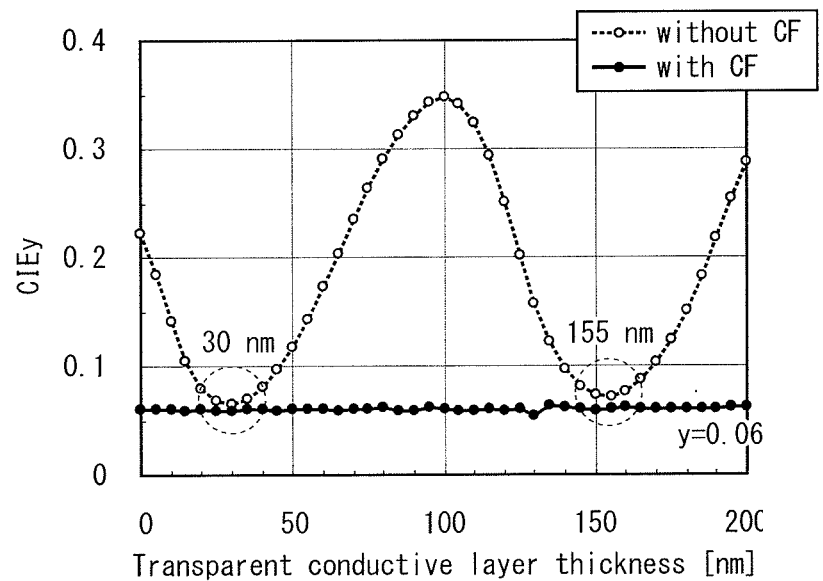
FIG. 6 is a graph indicating the relationship between physical thickness of the transparent conductive layer and organic EL element chromaticity, under the same conditions as FIG. 5.

Through experimentation, the inventors determined that varying the optical thickness of the first functional layer causes a change not only in luminous efficiency E1 but also in chromaticity CIEy. FIG. 6 is a graph indicating the relationship between the physical thickness of the transparent conductive layer 3 and the chromaticity for the organic EL element under the same conditions as FIG. 5.

The dashed line of FIG. 6 indicates the chromaticity when no colour filter is present in the organic EL element. As shown in FIG. 6, changing the physical thickness of the transparent conductive layer 3 in turn changes the chromaticity CIEy. Generally, the blue organic EL element is configured to have a chromaticity CIEy target value of 0.06 to 0.08. This is because the European Broadcasting Union (hereinafter EBU) standard uses a target value of 0.06, and the National Television System Committee (hereinafter, NTSC) standard uses a target value of 0.08. A chromaticity CIEy target value of 0.06 is most closely approximated when the physical thickness is 30 nm or 155 nm. Also, a physical thickness of 100 nm produces the chromaticity CIEy farthest from the target value. Accordingly, changing the physical thickness of the transparent conductive layer 3 in turn changes the chromaticity CIEy. Thus, the colour filter characteristics used to produce the chromaticity CIEy target value of 0.06 differ according to the physical thickness of the transparent conductive layer 3. Consequently, the colour filter characteristics used to produce the chromaticity CIEy target value of 0.06 also differ according to the optical thickness of the first functional layer.

The solid line in FIG. 6 indicates the colour when the colour filter is present in the organic EL element and the colour filter characteristics are adjusted according to the physical thickness. Naturally, the chromaticity CIEy is fixed at the target value of 0.06, regardless of the physical thickness.

Accordingly, varying the optical thickness of the first functional layer causes a change not only in luminous efficiency E1 but also in chromaticity CIEy. As indicated by the dashed lines of FIGS. 5 and 6, the chromaticity CIEy does not necessarily approach the target value despite luminous efficiency E1 being at a local maximum for a specific optical thickness. When the chromaticity CIEy is far from the target value, there is a need to provide a corresponding colour correction with the colour filter. As such, luminous efficiency E2 is diminished when the colour filter is provided. As a result, the optical thickness for a local maximum of the luminous efficiency E1 when the colour filter is absent differs from the optical thickness for a local maximum of the luminous efficiency E2 when the colour filter is provided. As shown in FIG. 5, luminous efficiency E2 is at a local maximum when the physical thickness of the transparent conductive layer 3 is in the neighborhood of 45 nm or of 155 nm.

A certain degree of manufacturing error in the physical thickness of each layer is unavoidable in the organic EL element manufacturing process. As such, design values are sought for which the organic EL element characteristics are hard to change (i.e., having a wide range of allowable tolerance for manufacturing error) despite the physical thickness of each layer not matching the given value. Also, an organic EL element having high luminous efficiency E2 when the colour filter is provided is beneficial. The inventors have considered the question of how best to achieve both of these benefits by setting the optical thickness of the first functional layer.

Firstly, when luminous efficiency E1 approaches extreme values, the change in luminous efficiency E1 becomes much smaller relative to the change in physical thickness. As such, greater tolerance is presumable. Reference to FIG. 5 provides candidate physical thicknesses for the transparent conductive layer 3 in the neighborhood of 20 nm, 80 nm, and 150 nm. Among these, luminous efficiency E2 is greatest when the physical thickness of the transparent conductive layer 3 is in the neighborhood of 150 nm. Accordingly, it is presumably possible to improve luminous efficiency and to increase the allowable tolerance for manufacturing error by using a physical thickness in the neighborhood of 150 nm (i.e., 443.2 nm when converted into the optical thickness of the first functional layer).

<2-2> Step 2

In step 1, described above, a value in the neighbourhood of 150 nm for the physical thickness of the transparent conductive layer 3 (i.e., 443.2 nm when converted into the optical thickness of the first functional layer) was determined to be beneficial.

The inventors considered an effective physical thickness range in the neighborhood of 150 nm for the transparent conductive layer 3. Specifically, a physical thickness range is sought that satisfies the following conditions 1 and 2.

(Condition 1)

An efficiency ratio is equal to or greater than 0.85, the efficiency ratio being computed with a denominator equal to the value of luminous efficiency E2 given physical thickness of 150 nm producing an extreme value of luminous efficiency E1 when the colour filter characteristics are adjusted for a chromaticity CIEy target value of 0.06, and with a numerator equal to the value of luminous efficiency E2 given any physical thickness when the colour filter characteristics are similarly adjusted for a chromaticity CIEy target value of 0.06.

(Condition 2)

When, for any physical thickness, the colour filter characteristics are adjusted for a chromaticity CIEy target value of 0.06 and the physical thickness is changed while maintaining the colour filter characteristics, the change in luminous efficiency E2 is within ±10%, the change in chromaticity CIEy is within ±0.015, and the range of physical thicknesses satisfying both terms is greater than 10 nm (i.e., 20 nm when converted into the optical thickness of the first functional layer).

A range satisfying condition 1 can be found using the solid line of FIG. 5.

That is, the efficiency ratio is computed using a denominator equal to the luminous efficiency E2 for a physical thickness of the transparent conductive layer 3 that is 150 nm, and using a numerator equal to the luminous efficiency E2 for any physical thickness. The range for which the efficiency ratio is equal to or greater than 0.85 is thus found. FIG. 11 indicates the results obtained from the simulation. The efficiency ratio row of FIG. 11 clearly shows that a physical thickness of the transparent conductive layer 3 that is equal to or greater than 143 nm (i.e., 428.9 nm when converted into the optical thickness of the first functional layer) satisfies condition 1.

The range satisfying condition 2 is found using the following procedure.

Figure 7:
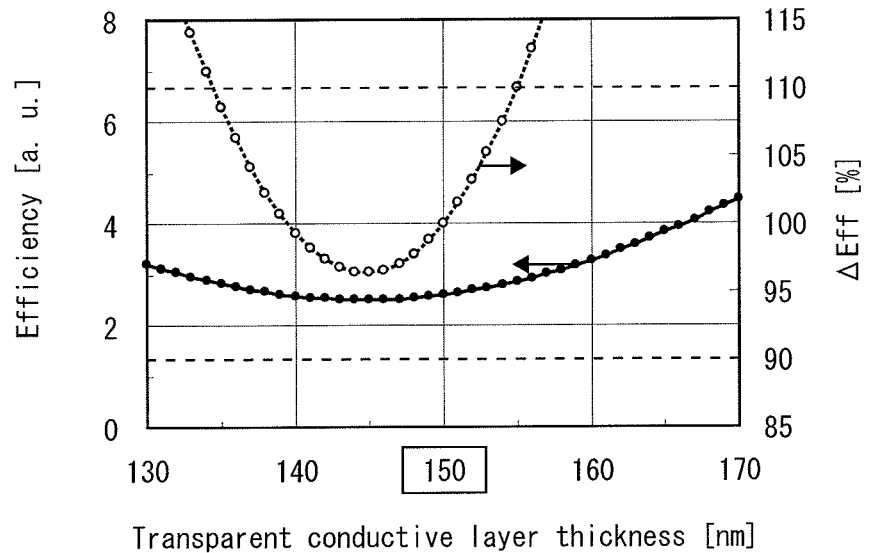
FIG. 7 is a graph illustrating changes in luminous efficiency when physical thickness of the transparent conductive layer is set to 150 nm and manufacturing error causes the physical thickness to be other than 150 nm.

FIG. 7 is a graph illustrating the changes in luminous efficiency when the physical thickness of the transparent conductive layer is set to 150 nm and manufacturing error occurs causing the physical thickness to be other than 150 nm.

Firstly, the colour filter characteristics are adjusted such that the chromaticity CIEy target value is 0.06 when the physical thickness of the transparent conductive layer 3 is 150 nm. Then, the physical thickness is changed in 1 nm increments while preserving the colour filter characteristics, and the luminous efficiency E2 is computed for each physical thickness. Plotting the results of these computations produces the solid line of FIG. 7. Also, the change in efficiency ΔEff is computed for luminous efficiency E2 at each physical thickness, relative to luminous efficiency E2 for the physical thickness of 150 nm. Plotting the results of these computations produces the dashed line of FIG. 7. In FIG. 7, the physical thickness is changed while the colour filter characteristics are maintained. FIG. 5, in contrast, indicates the change in physical thickness with the colour filter characteristics being appropriately adjusted for each physical thickness value. Accordingly, the curve plotted in FIG. 7 differs from the curve plotted in FIG. 5.

As FIG. 7 indicates, a range of 135 nm to 154 nm, inclusive, for the physical thickness of the transparent conductive layer 3 allows the change ΔEff in the luminous efficiency E2 to be constrained within ±10%. In the following explanation, the range of physical thickness for the transparent conductive layer 3 that satisfies these conditions is termed the luminous efficiency tolerance range.

Figure 8:
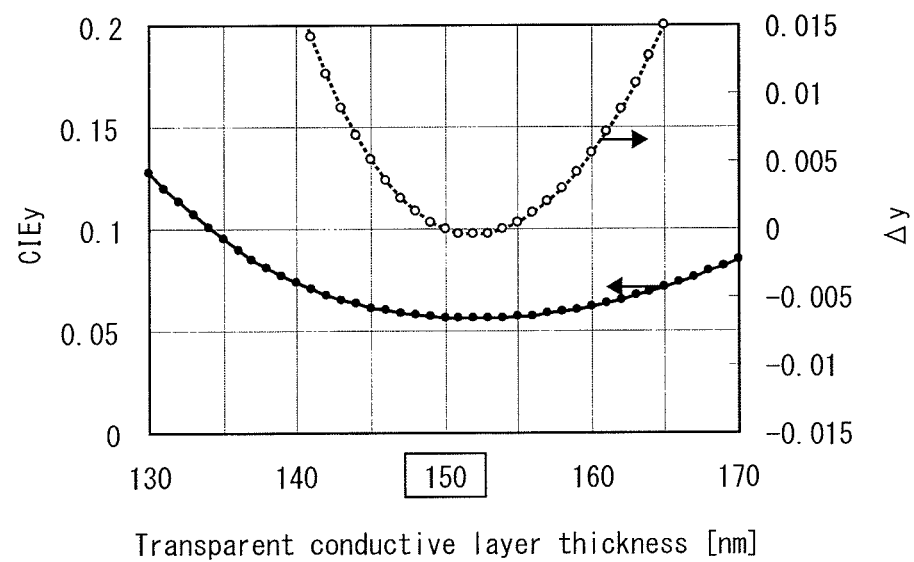
FIG. 8 is a graph indicating chromaticity change when physical thickness differs from a 150 nm design value due to manufacturing error, given the same conditions as FIG. 7.

FIG. 8 is a graph indicating the change in chromaticity when the physical thickness differs from the design value of 150 nm due to manufacturing error, given the same conditions as FIG. 7.

Firstly, the colour filter characteristics are adjusted such that the chromaticity CIEy target value is 0.06 when the physical thickness of the transparent conductive layer 3 is 150 nm. Then, the physical thickness is changed in 1 nm increments while preserving the colour filter characteristics, and the chromaticity CIEy is computed for each physical thickness. Plotting the results of these computations produces the solid line of FIG. 8. Also, the change in colour Δy is computed for the chromaticity CIEy at each physical thickness, relative to the chromaticity CIEy for the physical thickness of 150 nm. Plotting the results of these computations produces the dashed line of FIG. 8.

As FIG. 8 indicates, a range of 141 nm to 165 nm, inclusive, for the physical thickness of the transparent conductive layer 3 allows the change Δy in the chromaticity CIEy to be constrained within ±0.015. In the following explanation, the range of physical thickness for the transparent conductive layer 3 that satisfies this condition is termed the chromaticity tolerance range.

The luminous efficiency tolerance range tolerance obtained from FIG. 7 is of 135 nm to 154 nm, inclusive. Similarly, the chromaticity tolerance range tolerance obtained from FIG. 8 is of 141 nm to 165 nm, inclusive. Thus, the range satisfying both tolerance ranges is of 141 nm to 154 nm, inclusive, this range spanning 13 nm. In the following explanation, the range satisfying both conditions is termed the thickness tolerance span. Accordingly, given a setting value of 150 nm for the physical thickness of the transparent conductive layer 3, the thickness tolerance span of 13 nm satisfies both of the above-described conditions.

A physical thickness range satisfying condition 2, above, can be found by applying a similar process, in which the physical thickness of the transparent conductive layer 3 is varied in 1 nm increments. For reference, the following describes an example in which the setting value for the physical thickness of the transparent conductive layer 3 is 20 nm, with reference to FIGS. 9 and 10.

Figure 9:
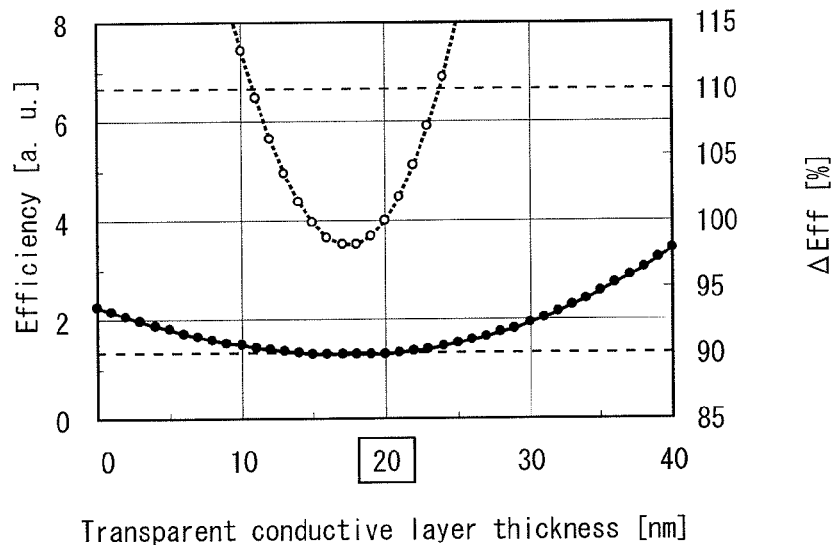
FIG. 9 is a graph illustrating luminous efficiency changes when physical thickness of the transparent conductive layer is set to 20 nm and manufacturing error causes the physical thickness to be other than 20 nm.

FIG. 9 is a graph illustrating the changes in luminous efficiency when the physical thickness of the transparent conductive layer 3 is set to 20 nm and manufacturing error occurs causing the physical thickness to be other than 20 nm. As FIG. 9 indicates, given a setting value of 20 nm for the physical thickness, the luminous efficiency tolerance range is of 11 nm to 23 nm, inclusive.

Figure 10:
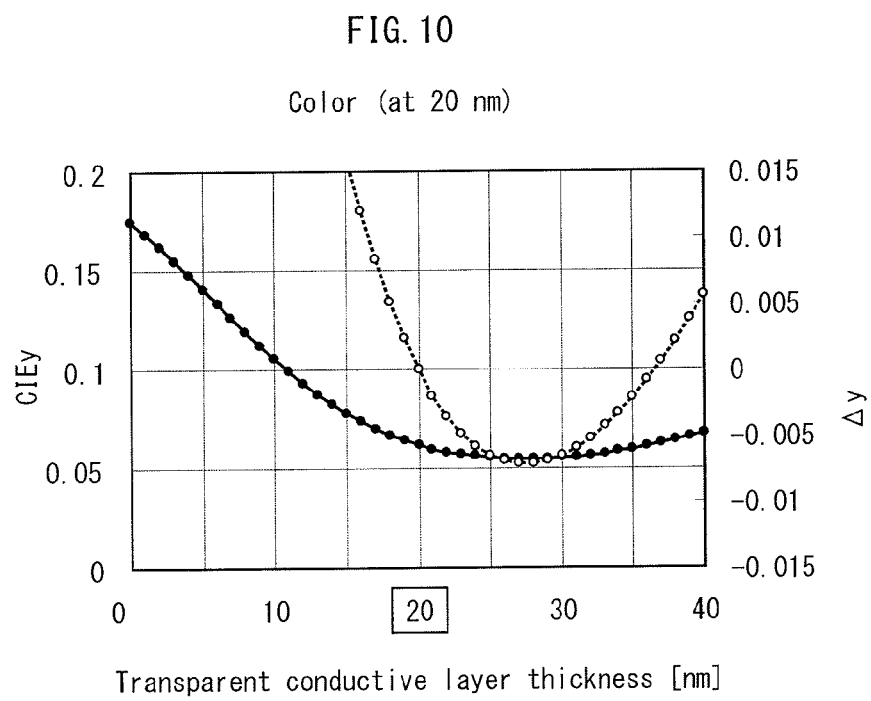
FIG. 10 is a graph indicating chromaticity change when physical thickness differs from a 20 nm design value due to manufacturing error, given the same conditions as FIG. 9.

FIG. 10 is a graph indicating the change in chromaticity when the physical thickness differs from the design value of 20 nm due to manufacturing error, given the same conditions as FIG. 9. As FIG. 10 indicates, given a setting value of 20 nm for the physical thickness, the chromaticity tolerance range is of 16 nm to 40 nm, inclusive. FIG. 10 does not indicate an upper limit value as the range is not shown beyond 40 nm. However, the upper limit value is obviously greater than 40 nm.

Thus, the range satisfying both of the above conditions is of 16 nm to 23 nm. Accordingly, the thickness tolerance span is 7 nm. As such, given a setting value of 20 nm for the physical thickness of the transparent conductive layer 3, the thickness tolerance span of 7 nm does not satisfy condition 2, described above.

FIG. 11 indicates the results obtained from the simulation. The thickness tolerance span row of FIG. 11 clearly shows that a physical thickness of the transparent conductive layer 3 that is equal to or smaller than 153 nm (i.e., 449.3 nm when converted into the optical thickness of the first functional layer) satisfies condition 2.

According to FIG. 11, the physical thickness range that satisfies both conditions 1 and 2 is of 143 nm to 153 nm, inclusive, for the transparent conductive layer 3 (i.e., 428.9 nm to 449.3 nm when converted into the optical thickness of the first functional layer).

<3> Effects

As described above, conditions 1 and 2 are both satisfied when the physical thickness of the transparent conductive layer is 143 nm to 153 nm, inclusive. The following describes the technical significance of each condition.

In step 1, luminous efficiency E1 was found to have an extreme value and luminous efficiency E2 was found to be comparatively high when the physical thickness of the transparent conductive layer 3 is 150 nm. Condition 1 requires an efficiency ratio equal to or greater than 0.85, based on luminous efficiency E2 as produced when the physical thickness of the transparent conductive layer 3 is 150 nm. Satisfying condition 1 enables greater luminous efficiency to be secured.

Generally, the colour filter characteristics are appropriately set in a setting step, and are not adjusted again in the manufacturing process. Accordingly, although the physical thickness of the transparent conductive layer 3 may differ from the setting value due to the manufacturing process, the prepared colour filter is nevertheless used as-is. FIGS. 7 and 8 are given with such a situation assumed. In this situation, condition 2 requires a thickness tolerance span for the physical thickness that falls within the tolerance range for the luminous efficiency and chromaticity, and that is greater than 10 nm (i.e., 20 nm when converted into the optical thickness of the first functional layer). Satisfying condition 2 enables a wide tolerance range of 10 nm or more to be secured for manufacturing error in physical thickness.

Accordingly, satisfying conditions 1 and 2 enables high luminous efficiency to be secured, while also securing a wide tolerance range for manufacturing error.

In the simulation, the physical thickness of the transparent conductive layer 3 is 143 nm to 153 nm, the physical thickness of the hole injection layer 4 is 40 nm, and the physical thickness of the hole transport layer 5 is 40 nm. As a result, the range of optical thickness for the first functional layer is 428.9 nm to 449.3 nm, inclusive. However, the relevant dimension for the resonator structure is the physical thickness of each layer, not the optical thickness of the first functional layer. Accordingly, given an optical thickness for the first functional layer of 428.9 nm to 449.3 nm, the same results are obtainable regardless of the physical thickness and refractive index of each layer.

The inventors further sought a thickness tolerance span for light-emitting layer 6b using a method similar to that used for the thickness tolerance span of the transparent conductive layer 3. FIG. 12 is a table indicating the thickness tolerance span for the transparent conductive layer 3 and the thickness tolerance span for the light-emitting layer 6b. According to the table, contrasting a physical thickness of 150 nm for the transparent conductive layer 3 to a physical thickness of 20 nm, 45 nm, or 80 nm shows that the thickness tolerance spans for not only the transparent conductive layer 3 but also the light-emitting layer 6b are wider in the 150 nm case. Accordingly, a physical thickness of 143 nm to 153 nm for the transparent conductive layer 3 enables a wide manufacturing error tolerance range to be secured for the light-emitting layer 6b.

<4> Layer Materials

<4-1> Substrate 1

Substrate 1 is, for example, a thin-film transistor (hereinafter, TFT) substrate. The material for substrate 1 is, for example a plate of soda glass, non-fluorescent glass, phosphoric glass, boric gas, or quartz, a plastic plate of acrylic resin, styrene resin, polycarbonate resin, epoxy resin, polyethylene, polyester resin, or silicone resin, a plastic film, or a metallic plate or metallic foil of aluminium oxide or similar.

<4-2> Reflective Electrode 2

The reflective electrode 2 is electrically connected to the TFT serving as substrate 1, serves as the anode in the organic EL element, and reflects light emitted by the light-emitting layers 6b, 6g, and 6r that is incident thereupon. The reflectivity may be imparted by the reflective electrode 2 material itself, or by a reflective coating applied to a surface portion of the reflective electrode 2. The reflective electrode 2 is made of, for example, Ag (silver), APC (an alloy of silver, palladium, and copper), ARA (an alloy of silver, rubidium, and gold), MoCr (an alloy of molybdenum and chrome), NiCr (an alloy of nickel and chrome), ACL (an alloy of aluminium, cobalt, and lanthanum), or similar.

<4-3> Transparent Conductive Layer 3

During the manufacturing process, the transparent conductive layer 3 serves as a protective layer preventing natural oxidation of the reflective electrode 2. The material for the transparent conductive layer 3 may be any conductive material of sufficient translucency to the light emitted by the light-emitting layers 6b, 6g, and 6r. For example, ITO (Indium Tin Oxide) or IZO (Indium Zinc Oxide) may be applicable.

<4-4> Hole Injection Layer 4

The hole injection layer 4 injects holes into the light-emitting layers 6b, 6g, and 6r. The material may be, for example, tungsten oxide ($WO_x$), molybdenum oxide ($MoO_x$), molybdenum-tungsten oxide ($Mo_xW_yO_z$), or another other transition metal oxide. Using a transition metal oxide enables improvements to the voltage and current density characteristics, which in turn improves the luminescent intensity. Alternatively, transition metal nitrides or other metallic compounds may be applicable.

<4-5> Hole Transport Layer 5

Examples of the material for the hole transport layer 6 include, as listed in Japanese Patent Application Publication No. H5-163488, a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, or a tetraphenylbenzene derivative. Among these, the porphyrin compound, the aromatic tertiary amine compound, and the styrylamine compound are especially beneficial.

<4-6> Light-Emitting Layers 6b, 6g, 6r

The material for the light-emitting layers 6b, 6g, and 6r is, for example, one of those listed in Japanese Patent Application Publication No. H5-163488, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, and so on.

<4-7> Electron Transport Layer 7

The material for the electron transport layer 7 is, for example, one of those listed in Japanese Patent Application Publication No. H5-163488, such as a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative.

In order to further improve electron injection, the material for the electron transport layer 7 may be doped with an alkali metal or alkali rare earth metal, such as sodium, barium, or calcium.

<4-8> Light-Transmitting Electrode 8

The light-transmitting electrode 8 serves as the cathode for the organic EL element. The material for the light-transmitting electrode 8 may be any conductive material of sufficient translucency to the light emitted by the light-emitting layers 6b, 6g, and 6r, such as ITO or IZO.

<4-9> Thin-Film Sealing Layer 9

The thin-film sealing layer 9 prevents erosion due to water, oxygen, and so on. The material for the thin-film sealing layer 9 is, for example, silicon nitride ($SiN_x$), silicon oxynitride ($SiO_xN_y$), aluminum oxide ($AlO_x$), or similar.

<4-10> Resin Sealing Layer 10

The resin sealing layer 10 affixes a back panel that includes layers from substrate 1 to the thin-film sealing layer 9, to a front panel that includes substrate 11 and the colour filters 13b, 13g, and 13r, and also serves to protect the layers from exposure to water, oxygen, and so on. The material for the resin sealing layer 10 is, for example, a resin adhesive or the like.

<4-11> Substrate 11

The material for substrate 11 is, for example a plate of soda glass, non-fluorescent glass, phosphoric glass, boric gas, or quartz, a plastic plate of acrylic resin, styrene resin, polycarbonate resin, epoxy resin, polyethylene, polyester resin, or silicone resin, or a plastic film or similar.

<4-12> Banks 12

The banks 12 may be made of any insulating material, with resistance to organic solvents being beneficial. Also, given that the bank 12 undergo etching, baking, and similar processes, a material with resistance to such processes is beneficial. The material for the banks 12 may be an organic material, such as a resin, or an inorganic material such as glass. Applicable organic materials include an acrylic resin, a polyimide resin, and a novolac-type phenol resin. Applicable inorganic materials include silicon oxide ($SiO_x$) and silicon nitride ($SiN_x$).

<4-13> Colour Filters 13b, 13g, 13r

The colour filters 13b, 13g, 13r each correct the chromaticity of the light emitted by the respective light-emitting layers 6b, 6g, 6r.

<5> Overall Configuration and Appearance of Display Device

Figure 13:
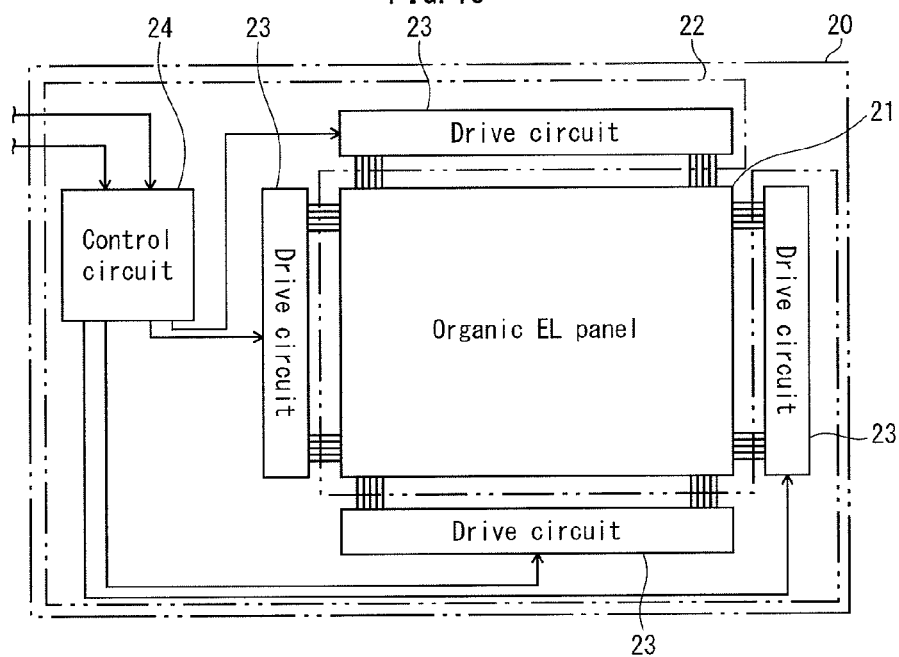
FIG. 13 is a block diagram of a display device pertaining to the Embodiment.
Figure 14:
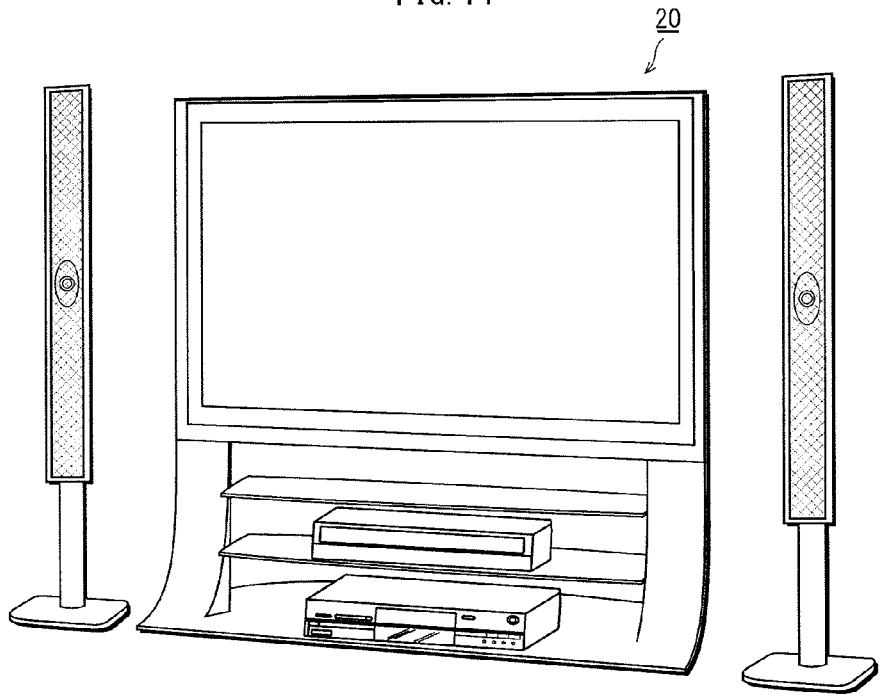
FIG. 14 illustrates the display device pertaining to the present Embodiment.

FIG. 13 is a block diagram of the display device pertaining to the present Embodiment. FIG. 14 illustrates the appearance of the display device pertaining to the present Embodiment. The display device 20 includes an organic EL panel 21 and a drive control unit 22 electrically connected thereto. The organic EL panel 21 has the pixel configuration illustrated in FIG. 1. The drive control unit 22 includes drive circuits 23 applying voltage between the reflective electrode 2 and the light-transmitting electrode 8 of the organic EL element, and a control circuit 24 controlling the operations of the drive circuits 23.

<6> Manufacturing Method

FIGS. 15A, 15B, 15C, 15D, 16A, 16B, and 16C describe a manufacturing method for the display device pertaining to the present Embodiment.

Figure 15A:
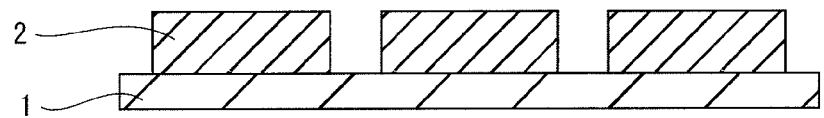
FIGS. 15A, 15B, 15C, and 15D describe a manufacturing method for the display device pertaining to the Embodiment.
Figure 15B:
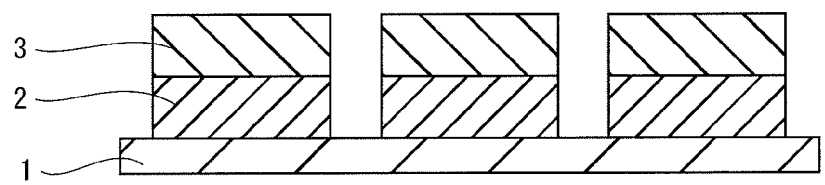

First, the reflective electrode 2 is formed over substrate 1 (FIG. 15A). Next, the transparent conductive layer 3 is formed over the reflective electrode 2 (FIG. 15B). At this point, the physical thickness of the transparent conductive layer 3 is set to, for example, 143 nm to 153 nm, inclusive. The transparent conductive layer 3 is, for instance, formed over the entirety of substrate 1 using a sputtering method, and then patterned for each pixel.

Figure 15C:
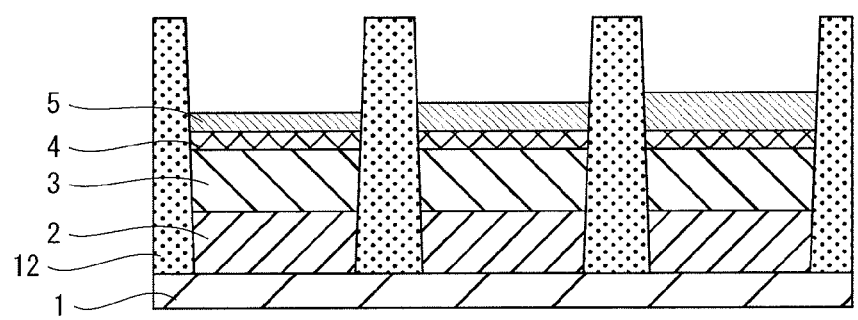

Next, the hole injection layer 4, the banks 12, and the hole transport layer 5, for instance, are formed over the transparent conductive layer 3 (FIG. 15C). At this point, for example, the physical thickness of the hole injection layer 4 is set to 40 nm, and the physical thickness of the hole transport layer 5 is set to 40 nm. Accordingly, the optical thickness of the first functional layer is of 428.9 nm to 449.3 nm. For the green and red organic EL elements, the optical thickness of the first functional layer may be otherwise.

Figure 15D:
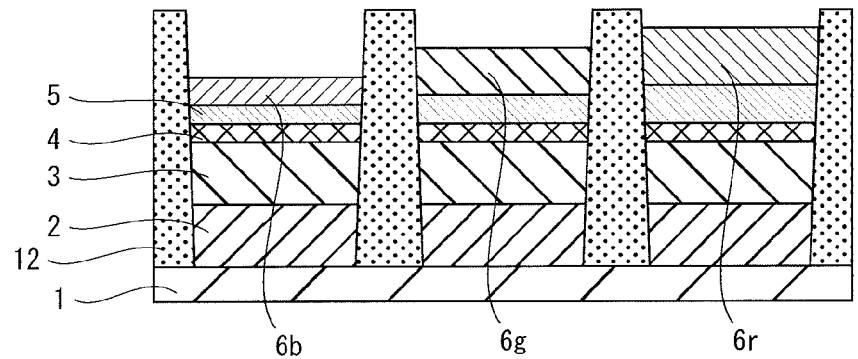

Next, the light-emitting layers 6b, 6g, and 6r are formed over the hole transport layer 5 using, for example, a print method such as the ink jet method (FIG. 15D).

Figure 16A:
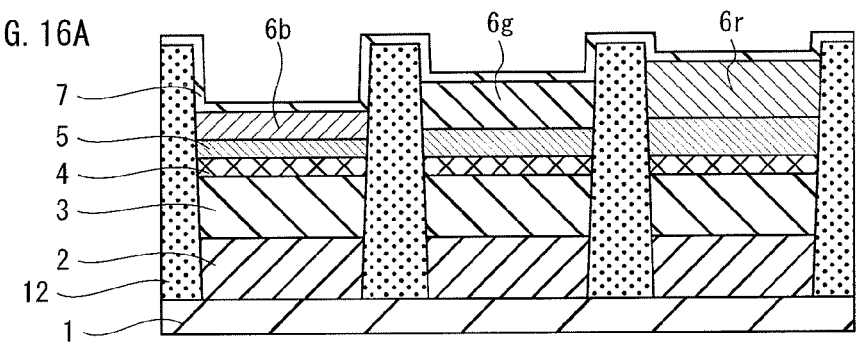
FIGS. 16A, 16B, and 16C describe a manufacturing method for the display device pertaining to the Embodiment.

Then, the electron transport layer 7 is formed over the light-emitting layers 6b, 6g, and 6r (FIG. 16A).

Figure 16B:
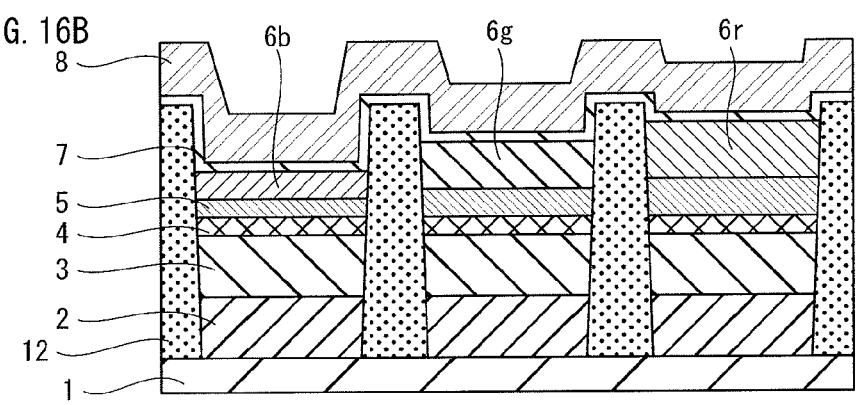

Next, the light-transmitting electrode 8 is formed over the electron transport layer 7 using vacuum deposition or sputtering methods (FIG. 16B).

Figure 16C:
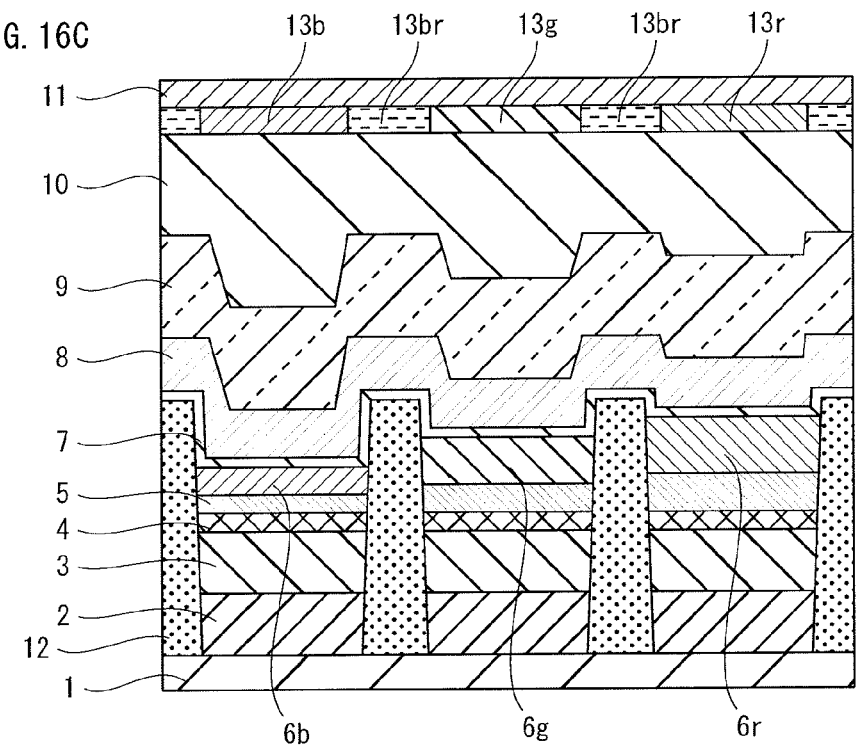

Afterward, the thin-film sealing layer 9 is formed over the light-transmitting electrode 8 using the vacuum deposition or sputtering methods, and substrate 11, having the colour filters 13b, 13g, and 13r and the black matrix 13br formed thereon, is affixed using the resin sealing layer 10 (FIG. 16C).

The display device is manufactured according to the above-described steps.

<7> Variations (1) Physical Thickness and Refractive Index of First Functional Layer In the above-described Embodiment, the optical thickness range for the first functional layer is 428.9 nm to 449.3 nm, inclusive. In order to achieve this range, the physical thickness of the first functional layer is of 204 nm to 300 nm, and the refractive index is of 1.5 to 2.1. As indicated in FIG. 3, the refractive index of each layer in the first functional layer is, broadly speaking, between 1.5 and 2.1, inclusive. Dividing the upper limit of the optical thickness, i.e., 449.3 nm, by the lower limit of the refractive index, i.e., 1.5, produces a physical thickness of 300 nm. Likewise, dividing the lower limit of the optical thickness, i.e., 428.9 nm, by the upper limit of the refractive index, i.e., 2.1, produces an optical thickness of 204 nm.

(2) Configuration of First and Second Functional Layers

In the above-described Embodiment, the first functional layer has a trilayer configuration. However, a monolayer, bilayer, or multilayer configuration of four or more layers is also applicable.

Similarly, in the above-described Embodiment, the second functional layer has a monolayer configuration. However, a multilayer configuration of two or more layers is also applicable.

(3) Light-Emitting Layers

In the above-described Embodiment, the organic EL element is described as using an organic material for the light-emitting layer. However, no such limitation is intended. For example, an inorganic EL element using an inorganic material for the light-emitting layer is also applicable.

INDUSTRIAL APPLICABILITY

The present disclosure is applicable to display devices and the like.

REFERENCE SIGNS LIST

1 Substrate
2 Reflective electrode
3 Transparent conductive layer
4 Hole injection layer
5 Hole transport layer
6b, 6g, 6r Light-emitting layer
7 Electron transport layer
8 Light-transmitting electrode
9 Thin-film sealing layer
10 Resin sealing layer
11 Substrate
12 Banks
13b, 13g, 13r Colour filters
13br Black matrix
20 Display device
21 Organic electroluminescence panel
22 Drive control unit
23 Drive circuits
24 Control circuit

The invention claimed is:

1. A light-emitting element, comprising:
a reflective electrode;
a light-transmitting electrode disposed opposite the reflective electrode;
a light-emitting layer emitting blue light and disposed between the reflective electrode and the light-transmitting electrode; and
a functional layer disposed between the reflective electrode and the light-emitting layer, wherein
given a luminous efficiency E1 of the light-emitting element with no colour filter, and a luminous efficiency E2 of the light-emitting element with a colour filter, an optical thickness of the functional layer satisfies:
 a first condition requiring an efficiency ratio that is equal to or greater than 0.85, the efficiency ratio being calculated by: taking, as the denominator, a value of the luminous efficiency E2 when the optical thickness of the functional layer has been adjusted to produce an extreme value of the luminous efficiency E1 and colour filter characteristics have been adjusted to achieve a target chromaticity; and taking, as the numerator, a value of the luminous efficiency E2 when the colour filter characteristics have been adjusted to achieve the target chromaticity for a given optical thickness of the functional layer; and
 a second condition requiring that, when the colour filter characteristics have been adjusted to achieve the target chromaticity for the given optical thickness of the functional layer, and the optical thickness of the functional layer has been changed while the colour filter characteristics remain stable, a variation in the luminous efficiency E2 is within ±10%, a variation in chromaticity is within ±0.015, and an optical thickness range satisfying both is at least 20 nm.

2. A display device, comprising:
a light-emitting element emitting blue light;
a light-emitting element emitting green light; and
a light-emitting element emitting red light, wherein
the light-emitting element emitting the blue light is the light-emitting element of claim 1.

* * * * *